(12) United States Patent
Hu et al.

(10) Patent No.: US 8,791,560 B2
(45) Date of Patent: *Jul. 29, 2014

(54) INTERDIGITATED CONDUCTIVE SUPPORT FOR GAN SEMICONDUCTOR DIE

(75) Inventors: Kunzhong Hu, Santa Monica, CA (US); Chuan Cheah, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/188,251

(22) Filed: Jul. 21, 2011

(65) Prior Publication Data

US 2011/0272705 A1    Nov. 10, 2011

Related U.S. Application Data

(63) Continuation of application No. 11/650,152, filed on Jan. 5, 2007, now Pat. No. 7,994,632.

(60) Provisional application No. 60/757,797, filed on Jan. 10, 2006.

(51) Int. Cl.
*H01L 23/48*    (2006.01)
*H01L 23/52*    (2006.01)

(52) U.S. Cl.
USPC ........... 257/690; 257/666; 257/692; 257/693; 257/E23.079

(58) Field of Classification Search
USPC ................. 257/666, 672, 690, 691, 692, 693, 257/E23.079
See application file for complete search history.

(56) References Cited

U.S. PATENT DOCUMENTS

| | | | | |
|---|---|---|---|---|
| 5,915,164 A | * | 6/1999 | Taskar et al. | 438/47 |
| 5,945,730 A | * | 8/1999 | Sicard et al. | 257/666 |
| 6,278,264 B1 | * | 8/2001 | Burstein et al. | 323/282 |
| 6,462,274 B1 | * | 10/2002 | Shim et al. | 174/535 |
| 6,740,907 B2 | * | 5/2004 | Sakamoto | 257/134 |
| 7,295,453 B2 | * | 11/2007 | Shiraishi et al. | 363/144 |
| 7,994,632 B2 | * | 8/2011 | Hu et al. | 257/692 |
| 2005/0145880 A1 | * | 7/2005 | Kawano | 257/107 |

* cited by examiner

*Primary Examiner* — Robert Huber
(74) *Attorney, Agent, or Firm* — Farjami & Farjami LLP

(57) ABSTRACT

A GaN die having a plurality of parallel alternating and closely spaced source and drain strips is contacted by parallel coplanar comb-shaped fingers of source and drain pads. A plurality of enlarged area coplanar spaced gate pads having respective fingers contacting the gate contact of the die. The pads may be elements of a lead frame, or conductive areas on an insulation substrate. Other semiconductor die can be mounted on the pads and connected in predetermined circuit arrangements with the GaN die.

10 Claims, 3 Drawing Sheets

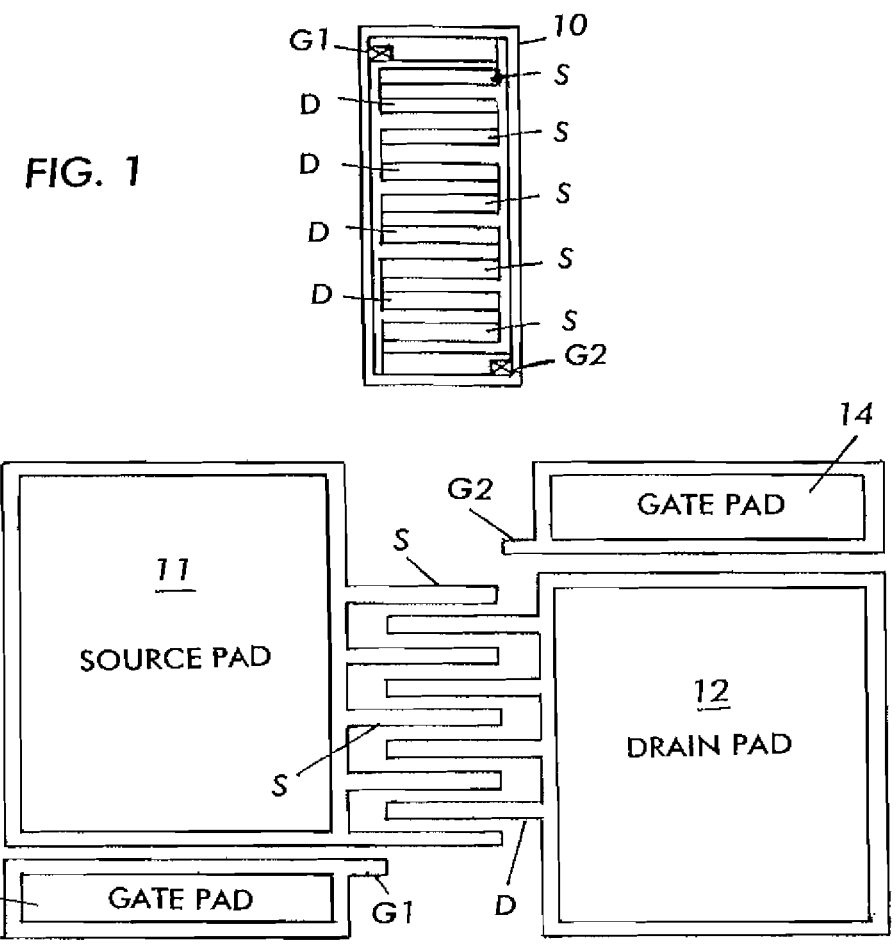
FIG. 1
FIG. 2a
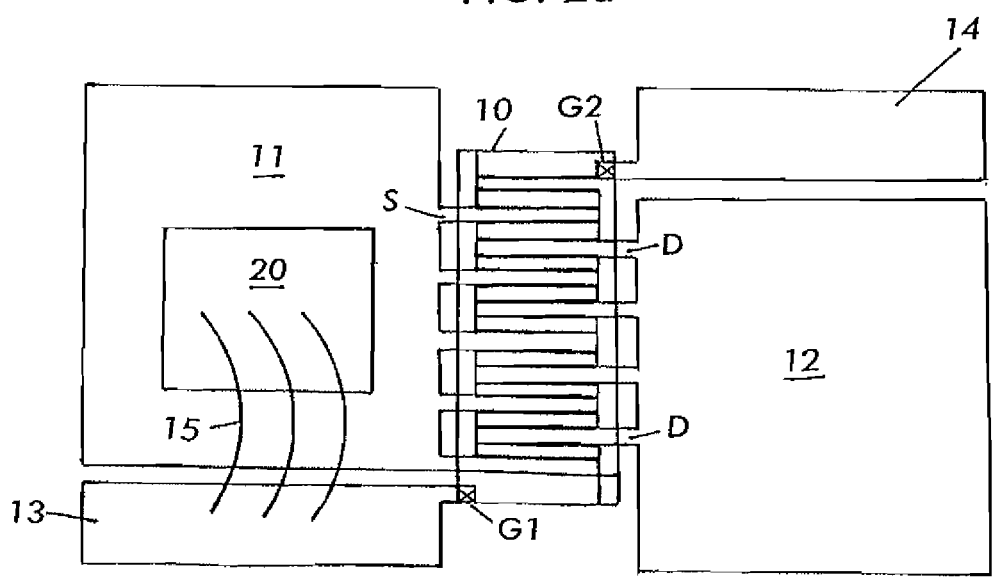
FIG. 2b

INTERDIGITATED CONDUCTIVE SUPPORT FOR GAN SEMICONDUCTOR DIE

This is a continuation of application Ser. No. 11/650,152 filed Jan. 5, 2007 now U.S. Pat. No. 7,994,632.

RELATED APPLICATIONS

This application claims the benefit of U.S. Provisional Application No. 60/757,797, filed Jan. 10, 2006, the entire disclosure of which is incorporated by reference herein.

FIELD OF THE INVENTION

This invention relates to a novel conductive support structure for GaN die and assemblies of GaN die with other die connected thereto.

BACKGROUND OF THE INVENTION

It is necessary to provide a conductive support for the packaging of GaN die (III-Nitride heterojunction die) and for other semiconductor die connected in various circuit configurations with the GaN die. Thus, coplanar conductive lead frames or laminates with conductive pad surfaces are conventionally used to support semiconductor die. The connection to GaN die, which are commonly bidirectional lateral conduction die, is complicated by the electrode pattern of the GaN die which commonly is a pattern of alternating thin closely spaced drain and source pads in a ladder-like configuration.

It would be desirable to provide a conductive support which would provide connectors to the closely spaced source and drain strips of a GaN die and to provide an effective heat sink for these electrodes and to provide a mounting area for other die such as silicon-based diodes and MOSFETs to be connected in various circuit arrangements with the GaN die.

SUMMARY OF THE INVENTION

In accordance with the invention, a conductive support for GaN die is provided with enlarged area conductor surfaces having spaced parallel sides with laterally projecting and coplanar spaced interdigitated fingers which align with and receive respective ones of the source and drain strips of a lateral conduction GaN based die thus forming an enlarged contact surface for wire bond or other connection to the GaN device source and drain electrodes. By "enlarged area" is meant an area equal to or greater than the area of the top surface of the die. At least two further enlarged gate areas are disposed adjacent edges of one or both of the source and drain connection area and are provided with respective coplanar projecting fingers to align with and contact the gate electrodes of the GaN die. Other die, for example, silicon based diodes and vertical conduction MOSFETs or other MOSgated devices may also be surface mounted on one or both of the enlarged source and drain pads and wire bonded in any desired circuit configuration with the GaN die.

BRIEF DESCRIPTION OF THE DRAWINGS

FIG. 1 is a top plan view of a GaN die having laterally disposed and alternating drain electrode strips and end gate electrodes.

FIG. 2a shows a lead frame constructed in accordance with the invention for receiving the die of FIG. 1.

FIG. 2b schematically shows the die of FIG. 1 mounted on the interdigitated fingers of the lead frame of FIG. 2a.

FIG. 3b shows the die of FIG. 1 on the interdigitated fingers of the lead frame of FIG. 3a.

FIG. 4b shows the die of FIG. 1 on the interdigitated fingers of the lead frame of FIG. 4a.

DESCRIPTION OF THE PREFERRED EMBODIMENTS

Figure 3A:
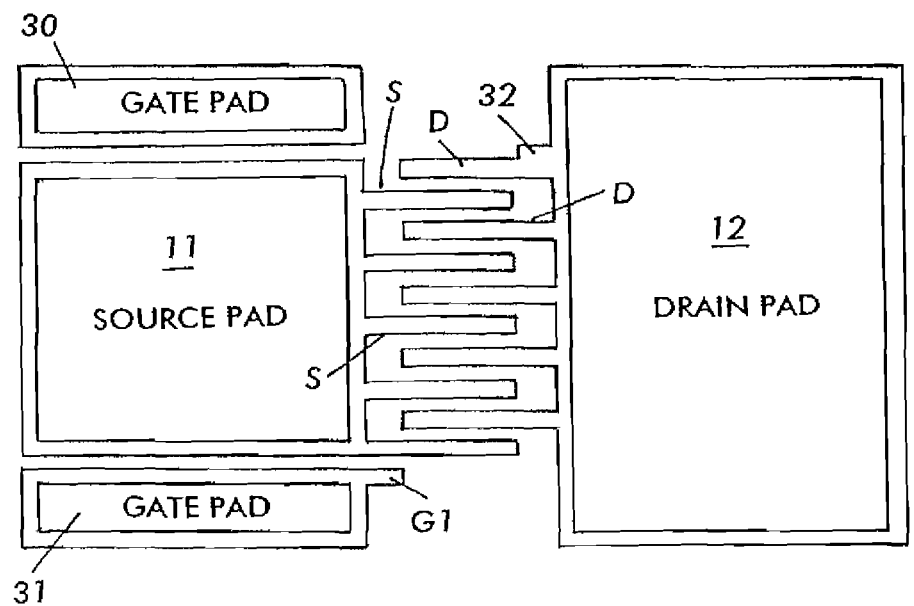
FIG. 3a shows a second embodiment of the lead frame of FIG. 2a with a modified gate pad arrangement.

FIG. 1 is a top view of a bidirectional conduction GaN die 10 having alternately spaced source electrodes S and drain electrodes D and gate electrodes G1 and G2. Such die are shown in detail in U.S. Patent Publication No. 2005/0139891 filed Dec. 3, 2004 entitled III-NITRIDE DEVICE WITH IMPROVED LAYOUT GEOMETRY in the names of Beach and Bridger (IR-2616) and in U.S. Patent Publication No. 2006/0131760 filed Sep. 13, 2005 entitled POWER SEMICONDUCTOR PACKAGE in the names of Standing and Clark (IR-2742), which are incorporated entirely herein by reference.

FIG. 2a is a top view of a conductive lead frame which has been patterned and stamped in accordance with the invention to receive the die of FIG. 1. Thus, the lead frame has an enlarged source pad 11 and an enlarged drain pad 12 which each have sets of comb-like extending fingers S and D respectively which correspond to the locations and width of the electrodes S and D respectively on die 10. All of Fingers S and D are in a common plane. Two gate pads 13 and 14 are also provided as shown; having respective extending lead frame fingers G1 and G2 for connection to electrodes G1 and G2 of die 10. Lead frame fingers G1 and G2 are also coplanar with fingers S and D.

FIG. 2b shows the die 10 laid over the various drain, source and gate fingers of the lead frame, and connected thereto as by soldering or by other conductive adhesives, or the like. The enlarged source and drain pads 11 and 12 respectively will act as excellent heat sinks for die 10.

The source and drain pads 11 and 12 can also receive diverse die or other components to be connected in circuit relation with die 10. Thus, in FIG. 2b, a diode die 20 has one electrode conductively secured or bonded to the source pad 11 and its upper surface wire bonded to the lower gate pad 12 by wire bonds 15.

A plastic housing, not shown, can enclose die 10 and the lead frame, with portions of the lead frame extending through the housing for external circuit connection.

Figure 3B:
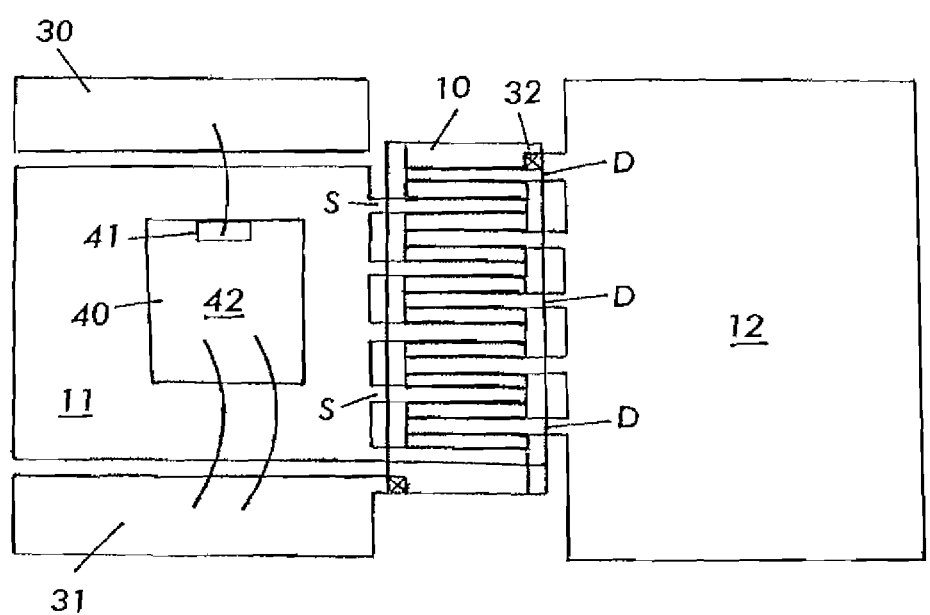

FIGS. 3a and 3b show a second embodiment of the invention.

The lead frame of FIG. 3a is modified from that of FIG. 2a to have gate pads 30 and 31 on opposite sides of the source pad 11. A projection 32 extends from the drain pad in FIG. 3a for connection to gate G2 of die 10.

The GaN device 10 is assembled to the lead frame of FIG. 3a in FIG. 3b. A vertical conduction silicon based MOSFET 40 has its bottom drain electrode secured to and connected to the source pad 11 in FIG. 3a, and its gate and source electrodes 41 and 42 respectively are wire bonded to gate pads 30 and 31 respectively as shown.

Figure 4A:
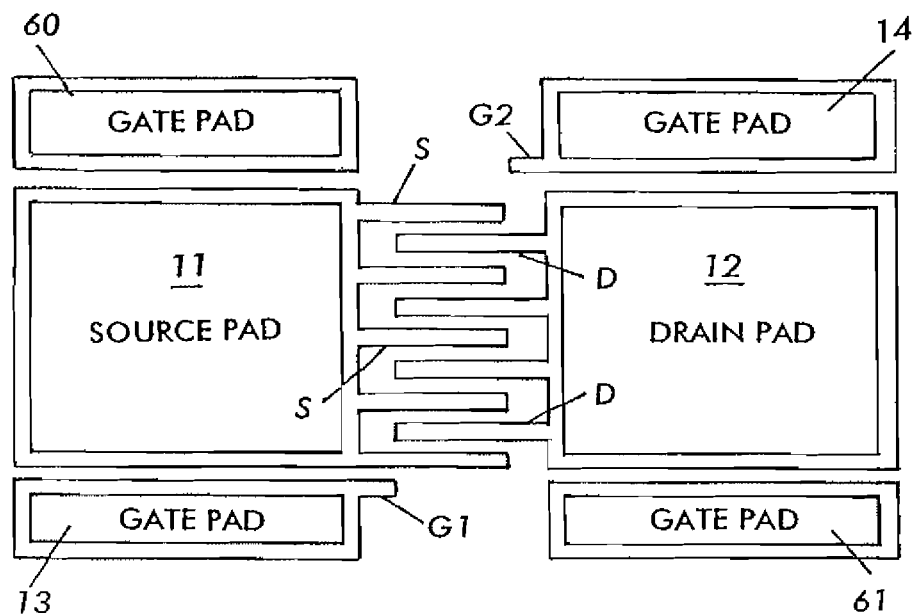
FIG. 4a shows a third embodiment of the invention with a further modified gate pad arrangement.
Figure 4B:
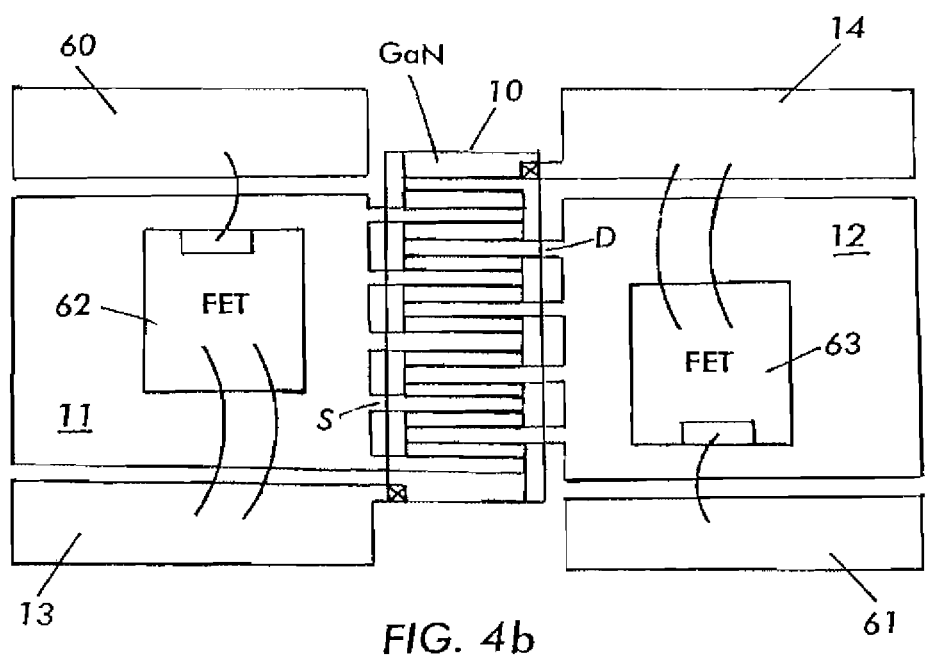

FIGS. 4a and 4b show a further embodiment of the invention. The lead frame of FIG. 4a is like that of FIG. 2a but two additional gate pads 60 and 61 are added above the source pad 11 and below the drain pad 12 respectively. Vertical conduction MOSFET die 62 and 63 then have their drain electrodes bonded to the source and drain pads 11 and 12 respectively.

The source electrodes and gate electrodes of MOSFETs 62 and 63 are then wire bonded as shown to form a circuit with die 10.

The lead frames in FIGS. 2a, 3a and 4a can be replaced by any other desired conductive substrate such as a laminated substrate with plural layers containing other circuit components, or an IMS substrate or the like.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A conductive support for a GaN semiconductor die comprising a plurality of parallel spaced and interleaved source and drain electrode strips on a surface of said GaN semiconductor die;
    said conductive support having a source pad and a coplanar drain pad;
    said source and drain pads each having a plurality of fingers and an enlarged area;
    said fingers of said source and drain pads being interdigitated and parallel to one another and spaced from one another;
    said fingers of said source and drain pads being disposed in alignment with and in contact with respective ones of said source and drain electrode strips;
    a second semiconductor die having source and drain electrodes, said drain electrode of said second semiconductor die being conductively fixed to one of said source or drain pads, said source electrode of said second semiconductor die and a gate electrode of said GaN semiconductor die being connected to a gate pad of said conductive support.

2. The conductive support of claim 1 wherein said gate pad is spaced from and coplanar with said source pad.

3. The conductive support of claim 2, wherein a gate finger extends from said gate pad and is in alignment with and in contact with said gate electrode.

4. The conductive support of claim 1, wherein said source and drain pads are part of a thin conductive lead frame.

5. The conductive support of claim 1, wherein said source and drain pads are supported on an insulation support surface.

6. A conductive support for a GaN semiconductor die comprising a plurality of parallel spaced and interleaved source and drain electrode strips on a surface of said GaN semiconductor die;
    said conductive support having a source pad a coplanar drain pad;
    said source and drain pads each having a plurality of fingers and an enlarged area;
    said fingers of said source and drain pads being interdigitated and parallel to one another and spaced from one another;
    said fingers of said source and drain pads being disposed in alignment with and in contact with respective ones of said source and drain electrode strips;
    a second semiconductor die having source and drain electrodes, said drain electrode of said second semiconductor die being conductively fixed to one of said source or drain pads, said source electrode of said second semiconductor die and a gate electrode of said GaN semiconductor die being connected to a gate pad of said conductive support, wherein said second semiconductor die is a MOS gated device.

7. The conductive support of claim 6 wherein said gate pad is spaced from and coplanar with said source pad.

8. The conductive support of claim 7, wherein a gate finger extends from said gate pad and is in alignment with and in contact with said gate electrode.

9. The conductive support of claim 6, wherein said source and drain pads are part of a thin conductive lead frame.

10. The conductive support of claim 6, wherein said source and drain pads are supported on an insulation support surface.

* * * * *